(12) United States Patent
Lee et al.

(10) Patent No.: US 11,928,103 B2
(45) Date of Patent: Mar. 12, 2024

(54) METHOD AND APPARATUS FOR CONFIGURATING DIGITAL TWIN

(71) Applicant: ELECTRONICS AND TELECOMMUNICATIONS RESEARCH INSTITUTE, Daejeon (KR)

(72) Inventors: Hyun Jeong Lee, Daejeon (KR); Yong-Woon Kim, Daejeon (KR); Sangkeun Yoo, Daejeon (KR); Jun Seob Lee, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 92 days.

(21) Appl. No.: 17/404,373

(22) Filed: Aug. 17, 2021

(65) Prior Publication Data
US 2022/0058182 A1 Feb. 24, 2022

(30) Foreign Application Priority Data

Aug. 18, 2020 (KR) .................. 10-2020-0103526
Aug. 6, 2021 (KR) .................. 10-2021-0103828

(51) Int. Cl.
*G06F 16/20* (2019.01)
*G06F 16/23* (2019.01)

(52) U.S. Cl.
CPC ............................ *G06F 16/2379* (2019.01)

(58) Field of Classification Search
CPC ... G06F 16/906; G06F 16/2379; G06F 16/178

USPC ........................................................ 707/756
See application file for complete search history.

(56) References Cited

U.S. PATENT DOCUMENTS

| 6,683,625 | B2 | 1/2004 | Muthusamy et al. | |
| 9,892,323 | B2 | 2/2018 | Cho et al. | |
| 10,854,194 | B2 | 12/2020 | Park et al. | |
| 2011/0149042 | A1 | 6/2011 | Lee et al. | |
| 2017/0286572 | A1* | 10/2017 | Hershey | B64F 5/60 |
| 2019/0004791 | A1* | 1/2019 | Brebner | G06F 9/44526 |

(Continued)

FOREIGN PATENT DOCUMENTS

| JP | 2020013557 A | 1/2020 |
| KR | 10-2067095 B1 | 1/2020 |

(Continued)

OTHER PUBLICATIONS

Yong-Woon Kim et al., "Characterization of Digital Twin", ETRI, 2020.

(Continued)

*Primary Examiner* — Vincent F Boccio
(74) *Attorney, Agent, or Firm* — LRK PATENT LAW FIRM (57) ABSTRACT

A method for configuring an observable object as a digital twin in a digital twin system of any one domain is provided. The method for configuring a digital twin includes defining a purpose for expressing the observable as a digital twin in the domain, organizing data based on a role of the observable object in the domain, configuring the observable object into the digital twin based on the data for the purpose, and synchronizing the observable object and the digital twin.

9 Claims, 9 Drawing Sheets

(56) References Cited

U.S. PATENT DOCUMENTS

2019/0102494 A1* 4/2019 Mars ................. G06F 30/20
2019/0179282 A1* 6/2019 Götz ................. G06F 11/22
2019/0384870 A1  12/2019 Shiraishi et al.
2020/0150637 A1* 5/2020 Yates ............... G05B 19/048
2020/0285464 A1* 9/2020 Brebner ........... G06F 11/362

FOREIGN PATENT DOCUMENTS

KR  10-2020-0081066 A  7/2020
KR  10-2020-0086772 A  7/2020

OTHER PUBLICATIONS

David Jones et al., "Characterising the Digital Twin: A systematic literature review", CIRP Journal of Manufactruing Science and Technology 29 (2020) 36-52.
Michael W. Grieves et al., "Virtually Intelligent Product Systems: Digital and Physical Twins", Complex System Engineering: Theory and Practice, pp. 175-200, Jul. 2019.

* cited by examiner

METHOD AND APPARATUS FOR CONFIGURATING DIGITAL TWIN

CROSS-REFERENCE TO RELATED APPLICATIONS

This application claims priority to and the benefit of Korean Patent Application Nos. 10-2020-0103526 and 10-2021-0103828 filed in the Korean Intellectual Property Office on Aug. 18, 2020 and Aug. 6, 2021, respectively, the entire contents of which are incorporated herein by reference.

BACKGROUND OF THE INVENTION

1. Field of the Invention

The present invention relates to a method and apparatus for configuring a digital twin. More specifically, the present invention relates to a method and apparatus for configuring a digital twin for expressing an observable object in reality (hereinafter referred to as an "observable object") as a digital twin, and interworking and information exchange between an observable object and a digital twin and between an observable object and several digital twin systems.

2. Description of Related Art

In the past, only each domain such as manufacturing, city, home, energy, medical, and education fields to which digital twins are applied, and observable objects belonging to that domain, were targeted for digital twins. Moving the object of a digital twin between different domains or its interworking between digital twin systems was not considered. Therefore, sharing and management of information of the objects of the digital twin scattered in each domain were not performed.

However, as digital twin technology spreads to all fields of industry and other application domains, interworking technology between digital twin systems configured for each domain is required, and information sharing and information management of the object of the digital twin scattered in each domain or moving across different domains are required for interworking between digital twin systems.

SUMMARY OF THE INVENTION

The present invention has been made in an effort to provide to a method and apparatus for configuring a digital twin that can share and manage information about objects of a digital twin that are distributed in multiple domains or perform multiple roles while moving across digital twin systems.

According to an embodiment of the present invention, a method for configuring an observable object as a digital twin in a digital twin system of any one domain is provided. The method for configuring a digital twin includes: defining a purpose for expressing the observable object as a digital twin in the domain; organizing data based on roles of the observable object in the domain; configuring the observable object into the digital twin based on data for the purpose; and synchronizing the observable object and the digital twin.

The organizing data may include configuring the data based on geometric three dimensions, time, and properties along with the roles in the domain.

The configuring the observable object into the digital twin may include: receiving information about the digital twin of the observable object that exists in a particular domain; and generating the digital twin by using the received digital twin information.

The receiving may include receiving information about the digital twin of the observable object by interworking with the digital twin of another domain while digital twins of two domains are interworking.

The configuring the observable object into the digital twin may include generating a digital twin having different characteristics from those of an existing domain to fit purposes and roles specified in other domains for the observable object.

The synchronizing may include reflecting changes of the digital twin to the digital twin.

The method for configuring a digital twin may further include interworking with a digital twin system of another domain in which the observable object performs a different role.

The interworking may include: receiving a request for information about the digital twin from the other domain; and transmitting information about the digital twin to the other domain.

According to another embodiment of the present invention, an apparatus for configuring an observable object as a digital twin in a digital twin system of any one domain is provided. The digital apparatus for configuring the digital twin includes a digital twin model author, a domain plug-in manager, a multi-role manager, and a data synchronizer. The digital twin model author defines a purpose for the observable object to perform a role in the domain, organizes data based on the role, and configures the observable object into a digital twin according to the purpose based on the configured data. The domain plug-in manager interworks the digital twin with a digital twin system in other domains. The multi-role manager manages properties according to roles performed by the observable object in a plurality of domains. The data synchronizer synchronizes between the observable object and the digital twin.

The digital twin model author may configure the observable object as the digital twin by using the digital twin information about the observable object received from the other domain through the interworking.

The data synchronizer may maintain the digital twin for the observable object between the plurality of domains in the same state.

The domain plug-in manager may search a connectable digital twin system when the observable object enters the other domain, and may select and connect a digital twin system that will perform the role of the observable object in the corresponding domain.

The domain plug-in manager may activate a digital twin registered in the corresponding domain when the observable object enters the other domain.

The digital twin model author may organize the data based on the role, geometric three-dimensions, time, and properties in the domain.

The digital twin model author may generate a digital twin having different characteristics from the other domain according to a purpose and a role in another domain for the observable object.

DETAILED DESCRIPTION OF THE EMBODIMENTS

Hereinafter, embodiments of the present invention will be described in detail with reference to the attached drawings so that a person of ordinary skill in the art may easily implement the present invention. The present invention may be modified in various ways, and is not limited thereto. In the drawings, elements that are irrelevant to the description of the present invention are omitted for clarity of explanation, and like reference numerals designate like elements throughout the specification.

Throughout the specification and claims, when a part is referred to "include" a certain element, it means that it may further include other elements rather than exclude other elements, unless specifically indicated otherwise.

Now, a method and apparatus for configuring a digital twin according to an embodiment of the present invention will be described in detail with reference to the drawings.

Figure 1:
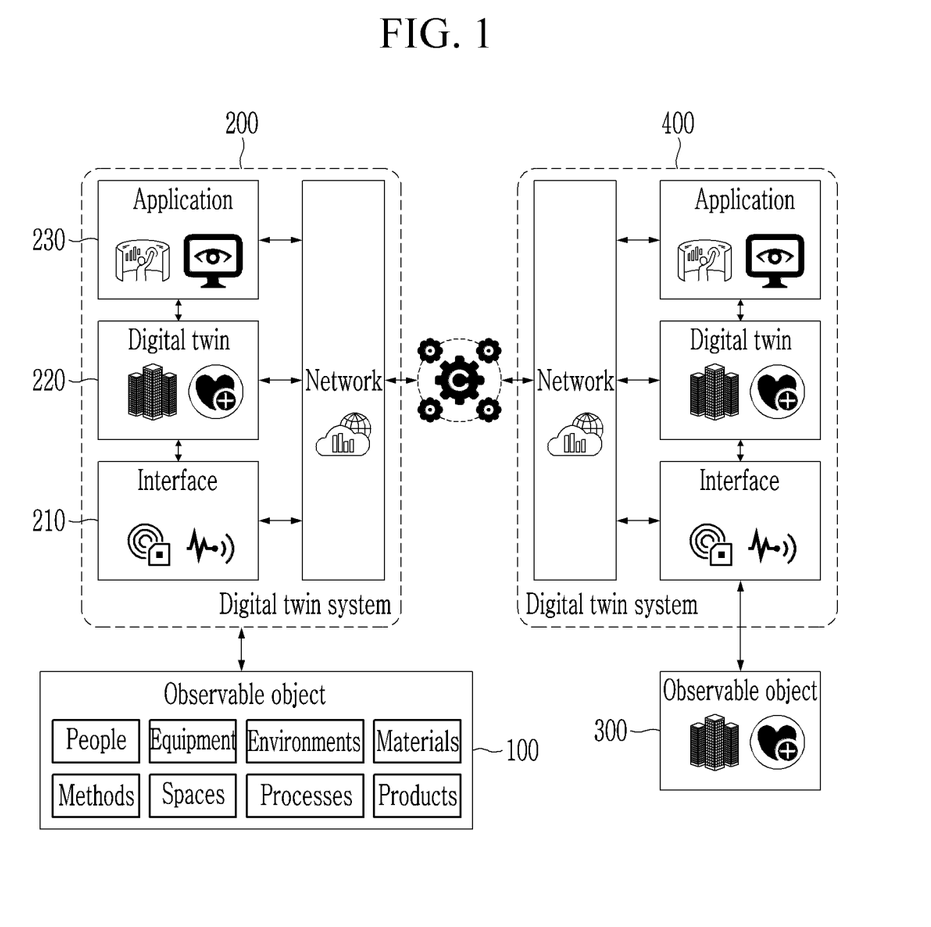
FIG. 1 is a diagram illustrating interworking between digital twin systems according to an embodiment of the present invention.

FIG. 1 is a diagram illustrating interworking between digital twin systems according to an embodiment of the present invention.

Referring to FIG. 1, digital twin systems 200 and 400 represent observable objects 100 and 300 of the corresponding domain as virtual objects on software, respectively. Here, the domain may be defined as an application domain such as manufacturing, city, home, energy, medical, transportation, environment, water supply field, etc., may be defined according to the life cycle of the observable object 100, may be subdivided and defined according to a physical and logical location, or may be subdivided and defined according to the role of the observable object 100. For example, in the manufacturing field, domains can be defined as equipment domain, conveyor system domain, packaging domain, inventory management domain, etc., and having the same physical configuration, but in the case of three-shift production, it may be defined by dividing it into different domains according to time zones. In the case of conveyor system, the system domain may be defined by dividing into a conveyor roller domain, a conveyor motor domain, a conveyor safety management domain, etc. As such, the meaning of the word domain is not limited to heterogeneous domains, and may be defined as different types of operation areas according to differences in purpose and function, and may be defined in various other ways.

The observable objects 100 and 300 may include various observable objects, such as people, equipment, energy environment, materials, methods, spaces, processes, products, and documents.

The digital twin systems 200 and 400 may include an interface layer 210, a digital twin layer 220, and an application layer 230.

The interface layer 210 provides an interface for the digital twin to communicate with the corresponding observable object.

The digital twin layer 220 performs a model authoring function, a domain plug-in function, a multi-role management function, and a data synchronization function.

The application layer 230 performs a past reproduction function, a current monitoring function, a future prediction function, a decision making function, and the like.

These digital twin systems 200 and 400 may be connected to each other through a network.

Figure 2:
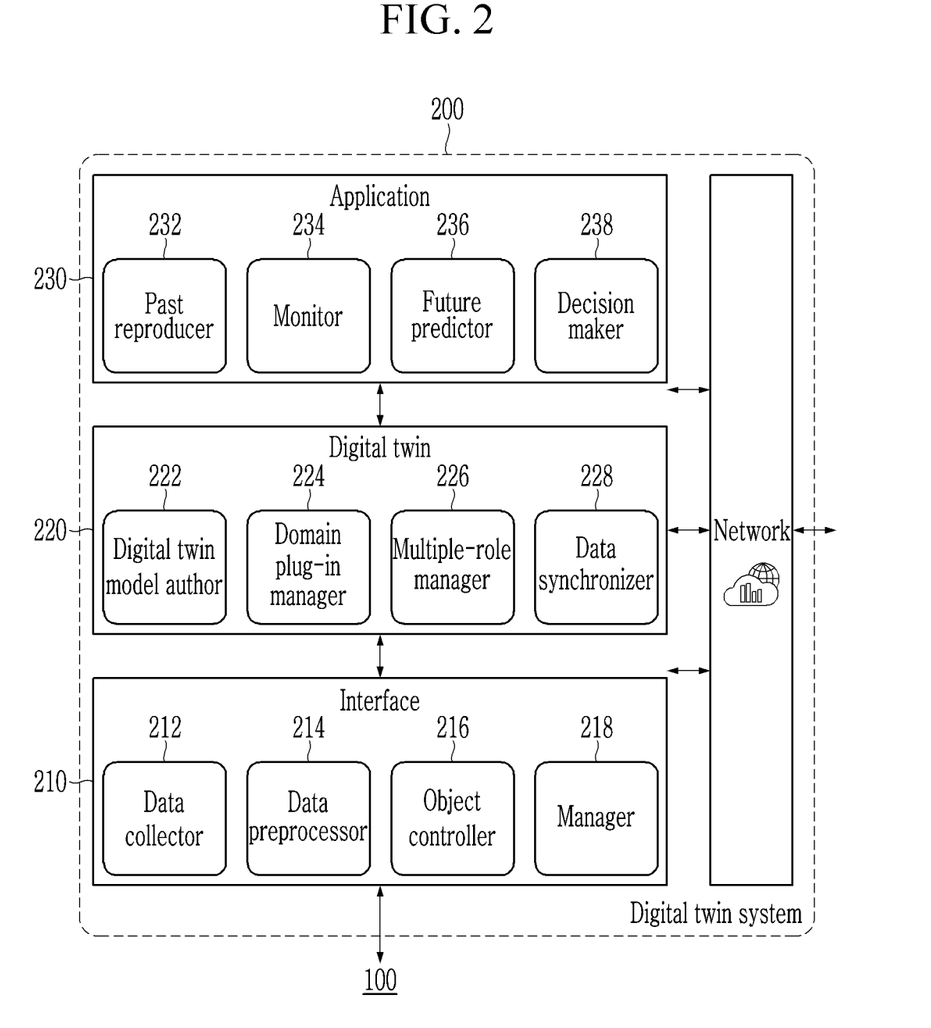
FIG. 2 is a diagram showing the functional configuration of the digital twin system shown in FIG. 1.

FIG. 2 is a diagram showing the functional configuration of the digital twin system shown in FIG. 1. Although only the digital twin system 200 is illustrated in FIG. 2, the digital twin system 400 may also be configured the same or similar to the digital twin system 200.

Referring to FIG. 2, the interface layer 210 includes a data collector 212, a data preprocessor 214, an object controller 216, and a manager 218.

The data collector 212 receives and collects data from the observable object 100.

The data preprocessor 214 performs functions such as removing erroneous data from the data collected by the data collector 212, refining data, and matching data units.

The object controller 216 performs a function of transmitting object control data for controlling the observable object 100.

The manager 218 performs functions of identifying and managing the observable object 100 in order to collect data and transmit object control data.

The digital twin layer 220 includes an apparatus for configuring a digital twin according to an embodiment of the present invention. The apparatus for configuring a digital twin includes a digital twin model author 222, a domain plug-in manager 224, a multi-role manager 226, and a data synchronizer 228.

The digital twin model author 222 includes a digital twin visible model authoring technology for expressing the visible characteristics of the observable object 100 and a digital twin dynamic model authoring technology for expressing the dynamic behavioral characteristics of the observable object 100. The digital twin model author 222 performs the function of modeling to configure the observable object 100 into a virtual digital twin object. In addition, the digital twin model author 222 includes a simulation function in which the digital twin model generated through authoring technology performs a virtual operation according to changes in input elements.

Digital twin modeling is the act of digitally generating an expression form for the structure, operation, behavior, current state, and state changes of the observable object 100, and the expression of the observable object 100 can be represented in a two-dimensional or three-dimensional form depending on the purpose. The behavioral expression of the observable object 100 may be represented in a way that a computer can process, such as mathematical formulas, procedural steps, mandatory and optional options, algorithmic rules, and the like. Since the expression method and precision of behavioral modeling for the observable object 100 vary depending on the purpose of modeling, the purpose of modeling is first defined, and then the structure, operation, and behavior are modeled. There may be several known modeling work methods, and the implementer may selectively adopt an appropriate method to perform it.

When the observable object 100 is expressed as a virtual object called a digital twin that can be processed by a computer, the term and concept of the digital twin modeling dimension is defined in order to solve how to set the structural data frame to configure the attribute information of the digital twin object. The modeling dimensions can be defined according to the structural model and the choice of what to consider as the key axis of data organization and what to consider as the detailed data attributes within the key axis. In an embodiment of the present invention, a data modeling dimension may be defined based on at least one of three dimensions (space of three horizontal-vertical-height axes), time, role, and properties. For example, the digital twin model author 222 organizes data based on the roles that the observable object 100 will perform in the corresponding domain, and may model the observable object 100 as a digital twin based on the organized data. However, it is not limited to these four dimension items. That is, other specific attributes can be picked up and set as additional dimensions. For example, referring to BIM (Building Information Modeling) products, starting with the two-dimensional and three-dimensional geometry, additionally including time as dimension axes, various specific items such as life cycle, stability, sustainability, and cost economy are included in detailed attribute information. Then high-dimensional BIM products such as 4D, 5D, 6D, 7D, etc. were released by changing the detailed attribute information to the dimension axes.

The digital twin behavior model authoring technology is a model authoring technology that allows the behavior model composing the digital twin to be continuously improved in a manual and automatic manner by the authoring manager according to feedback results, rather than being fixed in the initial development model. This technology may include a technique for dynamically adding/deleting/modifying data input variables and data output variables for a unit model that supports various dynamic characteristics of the corresponding domain, and that also supports interfaces with other domains, a technique for dynamically reconstructing the behavior and interface models of the unit model, and a user interface authoring technique for restructuring and adjusting the behavior and interface models for a target object by an administrator.

The domain plug-in manager 224 allows the observable object 100 to interwork with digital twin systems in different domains.

The observable object 100 may perform various roles within a domain, or may perform a different role from an existing domain in another domain.

A role means a purposeful action of the observable object 100 to be performed, and may consist of a series of element actions coupled with each other to perform the purposeful action. Roles can be defined according to time, place, and purpose. Roles for different purposes can be characterized by the individual identities that perform a corresponding role. The observable object 100 may perform different roles with different identities in different domains. The individual identity is called a multi-persona twin in the sense that one observable object 100 has multiple identities according to roles in each domain. Multi-persona twin means that one digital twin object is possible as a digital twin object with a different identity by being assigned with different roles in different domains.

For example, person A may have a role of a researcher at work, a role of a patient at a hospital, and a role of a parent at home. As such, one observable object 100 named A has various functional attributes and roles, such as a researcher, a patient, and a parent, depending on the domain, and the functional attributes and roles are expressed differently depending on the domain, but the intrinsic attributes of the observable object 100 do not change. That is, in the above example, the intrinsic attributes of a person does not change, but the functional attributes of a researcher and patient's parent may be different.

As another example, in a parking digital twin system, an ambulance, i.e., an emergency relief vehicle, has the role of a parking vehicle, and attribute information of the parking function such as the vehicle height, width, and vehicle type is required to allocate an optimal parking location. In a medical digital twin system, the ambulance has the role to transport patients, and attribute information of the first aid function such as patient gender, age, illness, and medical history is required. In a vehicle maintenance digital twin system, the ambulance has the role of a maintenance target, and attribute information of the maintenance function such as the model of the vehicle, mileage, and replacement time of consumables is required to prevent breakdown while driving.

As such, the observable object 100 has various functional attributes and roles according to domains.

The method in which the multi-persona twin performs different roles by interworking with the digital twin system of each domain can operate in the following two representative ways. However, embodiments of the present invention are not limited to these methods, and other methods may be possible by recombination of detailed functions.

The first method is to register attribute information for the roles in advance in the places where the roles to be performed for all multi-personas twins that the digital twin has, and to activate the multi-persona twin registered in each place when the observable object 100 enters each place. Here, this method is called 'digital twin awakening'.

The second method does not assume prior registration when the observable object 100 enters a certain place, but selects and accesses a digital twin system that will perform its role through the process of searching for a connectable digital twin system. This method can be referred to as digital twin mobility.

These two methods can also be realized by combining them with each other by referring to the Bluetooth pairing technique, for example.

The multi-role manager 226 manages property information according to roles when the observable object 100 performs multiple roles in multiple domains. A role is determined according to time, place, and purpose, and in order to realize a certain purpose, various detailed roles can be set, and they can be grouped and defined as a cluster of roles. For example, Person "A" performs the role of a doctor in the medical domain. "A" may be expressed as a pedestrian in the city domain. Also, if "A" finds an emergency patient "B" while walking in the city domain, "A" can perform medical activities such as first aid to "B" using its role as a doctor. {Doctor, pedestrian, medical activity} becomes a cluster of roles for "A". As such, a role represents an execution function for a behavioral action to achieve a certain purpose. If the purpose is different, the developed digital twin may also be expressed differently because the behavior model is different. Therefore, the digital twin model is defined according to the purpose.

The data synchronizer 228 provides a data synchronization and interaction interface between the observable 100 and the relevant digital twin, and keeps the digital twin between multiple domains in the same state. To this end, the data synchronizer 228 provides an interface using platform technology that can selectively provide various types of communication interface technologies according to the purpose of application, service, etc., a context-based state management and context-based state synchronization technology for synchronization between the observable object 100 and the digital twin, and digital twin context information generation and management technology between multiple domains.

The application layer 230 includes a past reproducer 232, a monitor 234, a future predictor 236, and a decision maker 238.

The past reproducer 232 reproduces the past situation by using the log information of the digital twin layer 220.

The monitor 234 monitors a complex situation such as the current location, role, environment, and regulation-related data by using the information of the digital twin layer 220.

The future predictor 236 predicts a future situation by using the information of the digital twin layer 220 and performs proactive processing according to the prediction.

The decision maker 238 supports decision-making, such as reducing operating costs and improving operational efficiency, by using the information of the digital twin layer 220.

Figure 3:
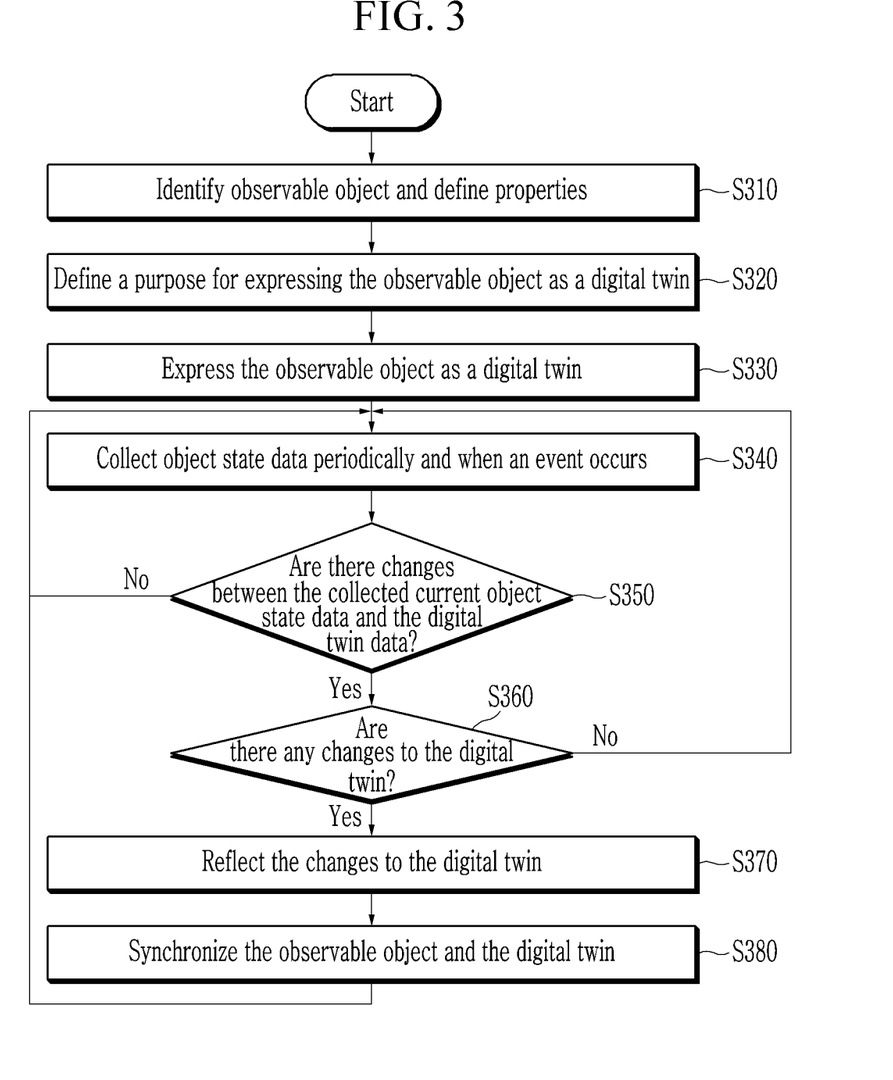
FIG. 3 is a flowchart illustrating a method for generating a digital twin in a digital twin system according to an embodiment of the present invention.

FIG. 3 is a flowchart illustrating a method for generating a digital twin in a digital twin system according to an embodiment of the present invention.

Referring to FIG. 3, the apparatus for configuring a digital twin of the digital twin system 200 identifies the observable object 100 and defines behavioral characteristics and corresponding properties (S310).

The apparatus for configuring a digital twin of the digital twin system 200 defines a purpose for expressing the observable object 100 as a digital twin (S320). The act of defining the purpose includes defining the requirements for the digital twin components necessary to achieve the purpose.

The apparatus for configuring a digital twin of the digital twin system 200 expresses the observable object 100 as a digital twin in the form of a visible and dynamic behavior model based on the purpose (S330).

The apparatus for configuring a digital twin of the digital twin system 200 collects object state data from the observable object 100 periodically and when an event occurs (S340).

The apparatus for configuring a digital twin of the digital twin system 200 checks the change between the collected current object state data of the observable object 100 and the digital twin data expressed by the current digital twin (S350). Since the situation of the observable object 100 can change, the apparatus for configuring a digital twin of the digital twin system 200 periodically collects object state data from the observable object 100 and when an event occurs, and checks changes to whether the collected object state data is the same as the data expressed by the digital twin.

If a change occurs between the current object state data of the observable object 100 and the digital twin data expressed in the current digital twin, the apparatus for configuring a digital twin of the digital twin system 200 checks whether there are any changes to the digital twin, such as requirements, purpose, roles, status, etc., of the digital twin (S360).

If there is no change to the digital twin, the apparatus for configuring a digital twin of the digital twin system 200 repeats from step S340 again.

On the other hand, the apparatus for configuring a digital twin of the digital twin system 200, when operational changes of the digital twin occur, reflects the changes to the digital twin of the digital twin system (S370), and synchronizes the observable object 100 and the digital twin (S380).

Figure 4:
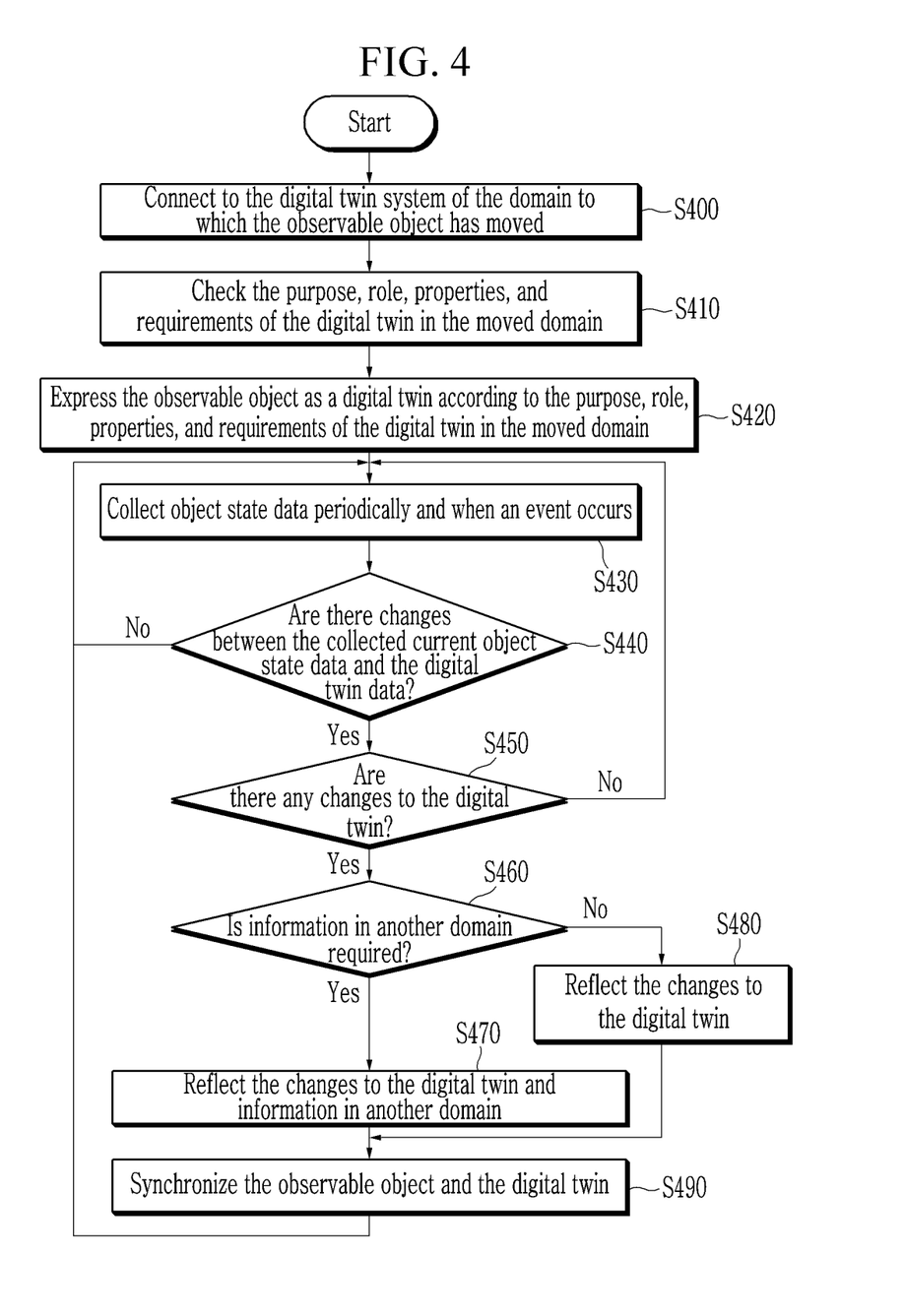
FIG. 4 is a flowchart illustrating a digital twin moving method in a digital twin system according to an embodiment of the present invention.

FIG. 4 is a flowchart illustrating a digital twin moving method in a digital twin system according to an embodiment of the present invention. FIG. 4 illustrates a case in which the observable object 100 moves from the domain of the digital twin system 200 to the domain of the digital twin system 400.

Referring to FIG. 4, the apparatus for configuring a digital twin of the digital twin system 200 connects to the digital twin system 400 of the domain to which the observable object 100 has moved (S400).

The apparatus for configuring a digital twin of the digital twin system 400 of the domain to which the observable object 100 has moved checks the purpose, role, properties, and requirements of the digital twin in the corresponding domain (S410).

The apparatus for configuring a digital twin of the digital twin system 400 expresses the observable object 100 as a digital twin according to the purpose, role, properties, and requirements of the digital twin in the domain to which the observable object 100 has moved (S420).

The apparatus for configuring a digital twin of the digital twin system 400 periodically collects object state data from the observable object 100 and when an event occurs (S430).

The apparatus for configuring a digital twin of the digital twin system 400 checks the change between the collected current object state data of the observable object 100 and the digital twin data expressed by the current digital twin (S440).

When a change occurs between the current object state data of the observable object 100 and the digital twin data expressed in the current digital twin, the apparatus for configuring a digital twin of the digital twin system 400 checks whether there are any changes to the digital twin, such as requirements, purpose, status, role, etc. of the digital twin (S450).

When changes to the digital twin occurs, the apparatus for configuring a digital twin of the digital twin system 400 checks whether information on the observable object 100 in another domain is required for the digital twin (S460).

When information on the observable object 100 in another domain is required for the digital twin, the apparatus for configuring a digital twin of the digital twin system 400 requests and receives information from the other domain, and then reflects the changes of the digital twin and information in another domain, in the digital twin (S470), and synchronizes the observable object 100 and the digital twin (S490). When information on the observable object 100 in another domain is required for the digital twin, the apparatus for configuring a digital twin of the digital twin system 400 may request and receive information on the observable object 100 in another domain through interworking with the digital twin system of another domain.

On the other hand, if there is no change to the digital twin, the apparatus for configuring a digital twin of the digital twin system 400 repeats from step S430.

In addition, as a result of checking in step S460, if information in other domains is not required, the apparatus for configuring digital twin of the digital twin system 400 reflects the changes of the requirements, purpose, status, roles, etc. to the digital twin in the digital twin (S480), and synchronizes the observable object 100 and the digital twin (S490).

Figure 5:
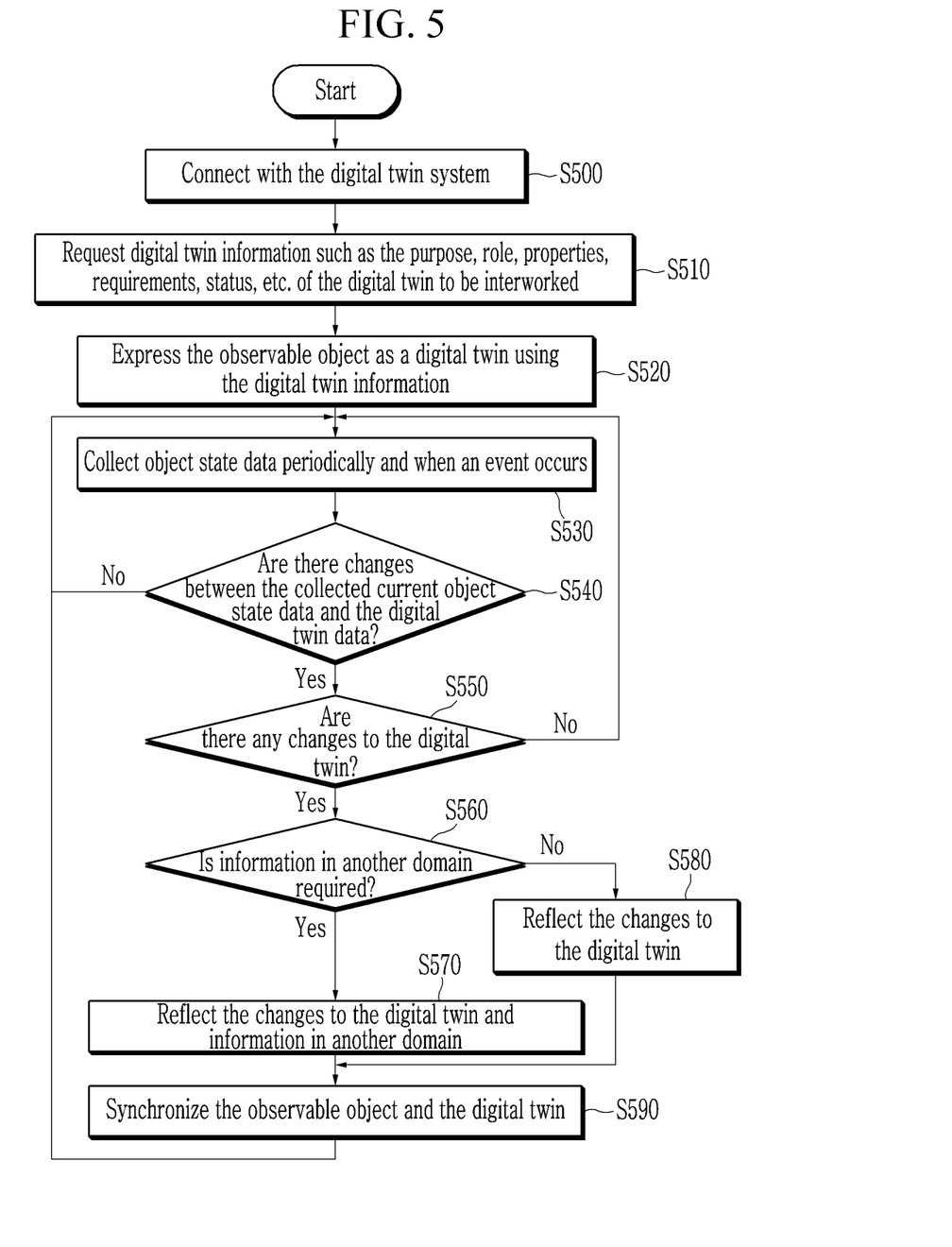
FIG. 5 is a diagram illustrating a method for interworking between digital twin systems according to an embodiment of the present invention.

FIG. 5 is a diagram illustrating a method for interworking between digital twin systems according to an embodiment of the present invention.

Referring to FIG. 5, for interworking between digital twin systems 200 and 400 for the same observable object 100 in different domains, the apparatus for configuring a digital twin of the digital twin system 200 performs a connection with the digital twin system 400 of another domain to be interworked (S500).

The apparatus for configuring a digital twin of the digital twin system 200 requests digital twin information such as the purpose, role, properties, requirements, status, etc. of the digital twin to be interworked to the digital twin system 400 (S510), and receives the digital twin information from the digital twin system 400.

The apparatus for configuring a digital twin of the digital twin system 200 expresses the observable object 100 as a digital twin using the digital twin information received from the digital twin system 400 (S520). The apparatus for configuring a digital twin of the digital twin system 200 may express the observable object 100 as a digital twin using digital twin information such as the purpose, role, properties, requirements, status, etc. for the digital twin in the digital twin system 200, and digital twin information received from the digital twin system 400.

The apparatus for configuring a digital twin of the digital twin system 200 periodically collects object state data from the observable object 100 and when an event occurs (S530).

The apparatus for configuring a digital twin of the digital twin system 200 checks the change between the current object state data of the observable object 100 and the digital twin data expressed in the current digital twin (S540).

When a change occurs between the current object state data of the observable object 100 and the digital twin data expressed in the current digital twin, the apparatus for configuring a digital twin of the digital twin system 200 checks whether there are any changes to the digital twin, such as requirements, purpose, status, roles, etc. of the digital twin (S550).

When changes to the digital twin occur, the apparatus for configuring a digital twin of the digital twin system 200 checks whether information on the observable object 100 in another domain is required for the digital twin (S560).

When information on the observable object 100 in a particular other domain is required for the digital twin, the apparatus for configuring a digital twin of the digital twin system 200 requests and receives information from the particular domain, and then reflects the changes of the digital twin and information received from the domain, in the digital twin (S570), and synchronizes the observable object 100 and the digital twin (S590). When information on the observable object 100 in the particular other domain is required for the digital twin, the apparatus for configuring a digital twin of the digital twin system 200 may request and receive information on the observable object 100 in the domain through interworking with the digital twin system of the domain.

On the other hand, if there is no change to the digital twin, the apparatus for configuring a digital twin of the digital twin system 200 repeats from step S530.

In addition, as a result of checking in step S560, if information in other domains is not required, the apparatus for configuring a digital twin of the digital twin system 200 reflects the changes of the requirements, purpose, status, roles, etc. to the digital twin in the digital twin (S580), and synchronizes the observable object 100 and the digital twin (S590).

Figure 6:
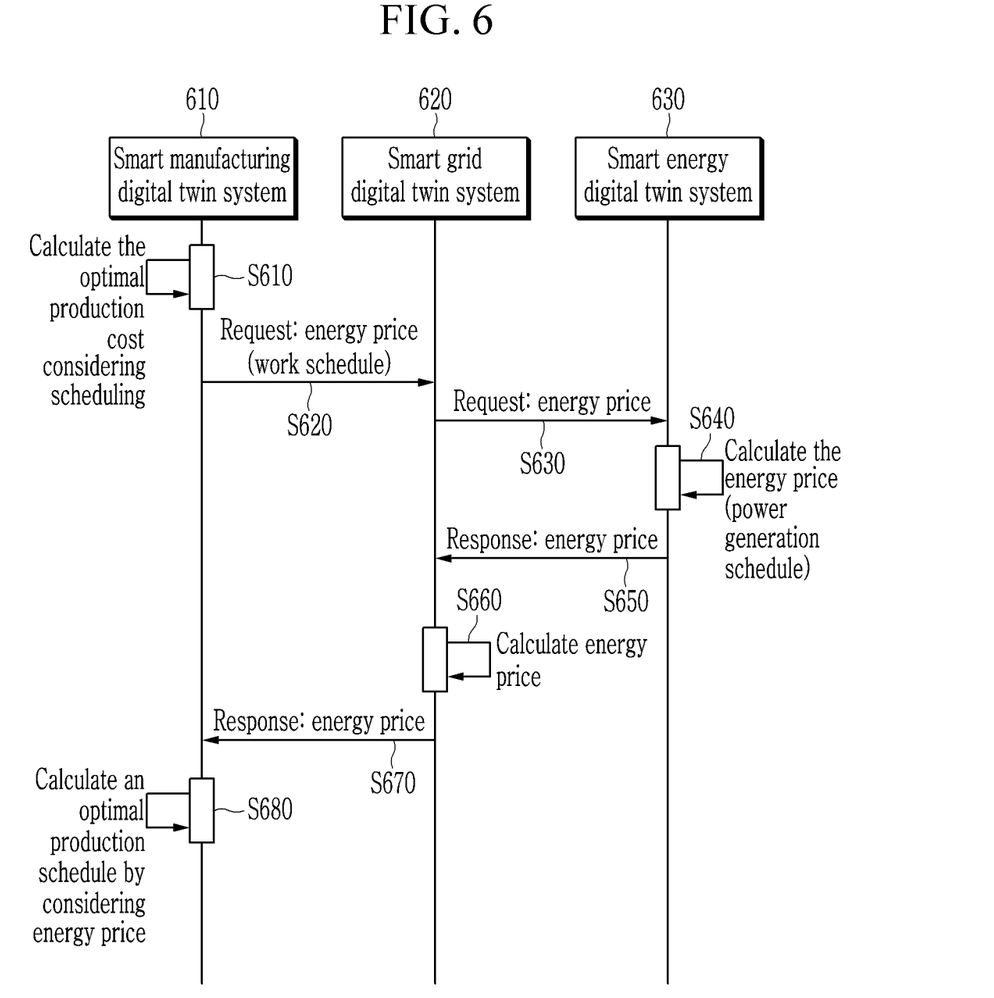
FIG. 6 is a diagram illustrating an example of interworking between digital twin systems existing in different domains according to an embodiment of the present invention.

FIG. 6 is a diagram illustrating an example of interworking between digital twin systems existing in different domains according to an embodiment of the present invention.

Referring to FIG. 6, it is assumed that there are three digital twin systems of a smart manufacturing digital twin system 610, a smart grid digital twin system 620, and a smart energy digital twin system 630.

The smart manufacturing digital twin system 610 calculates the optimal production cost considering scheduling (S610), and requests the energy price over time from the smart grid digital twin system 620 for a work schedule (S620).

The smart grid digital twin system 620 requests the energy price over time from the smart energy digital twin system 630 (S630).

The smart energy digital twin system 630 calculates the energy price over time (S640), and adjusts the power generation schedule to produce energy at an optimal price.

The energy digital twin system 630 transmits the energy price over time to the smart grid digital twin system 620 (S650).

The smart grid digital twin system 620 calculates the energy price (distribution cost) over time by considering the energy price over time received from the smart energy digital twin system 630 (S660), and responds to the energy price request by transmitting the energy price over time calculated to the smart manufacturing digital twin system 610 (S670).

The smart manufacturing digital twin system 610 calculates an optimal production schedule by considering energy prices over time (S680).

As such, the smart manufacturing digital twin system 610, the smart grid digital twin system 620, and the smart energy digital twin system 630 that exist in different domains generate a digital twin called energy price for the optimal production schedule of the smart manufacturing digital twin system 610, and the smart manufacturing digital twin system 610 can calculate an optimal production schedule in consideration of the energy price over time through interworking between the smart manufacturing digital twin system 610, the smart grid digital twin system 620, and the smart energy digital twin system 630.

Figure 7:
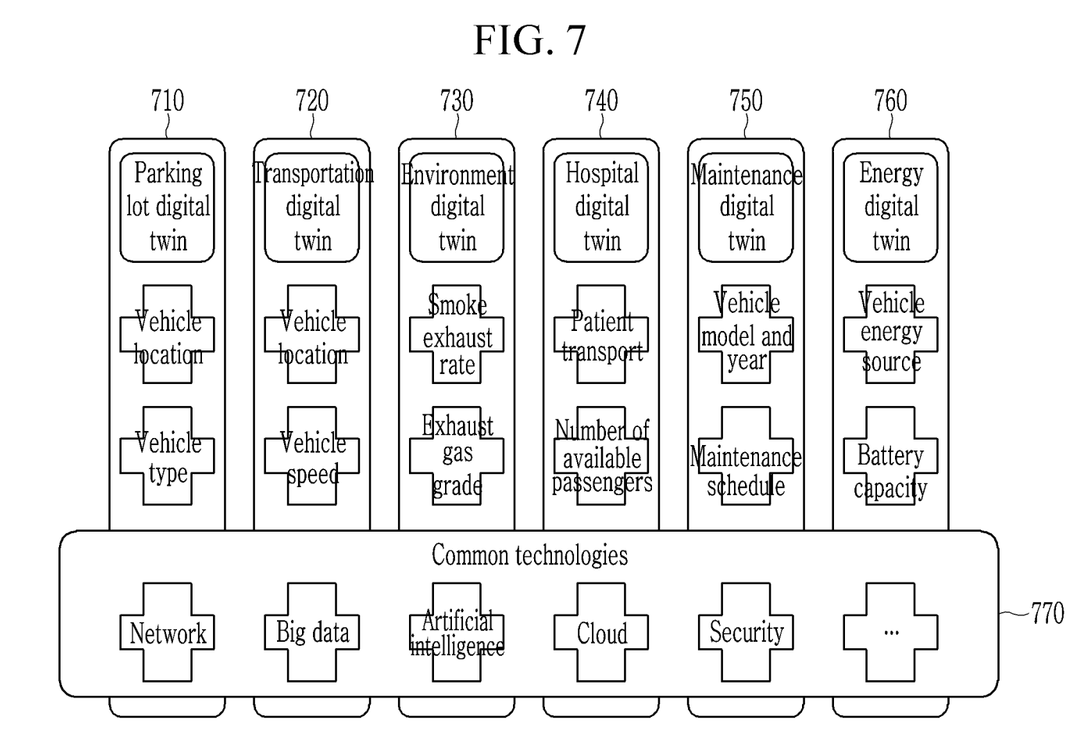
FIG. 7 is a diagram illustrating an example in which multi-faceted characteristics of an object are represented in the form of multiple roles according to a domain of a digital twin according to an embodiment of the present invention.

FIG. 7 is a diagram illustrating an example in which multi-faceted characteristics of an object are represented in the form of multiple roles according to a domain of a digital twin according to an embodiment of the present invention.

Referring to FIG. 7, a vehicle is shown as an example of the observable object 100. In relation to the vehicle, the digital twin system of each domain generates a parking lot digital twin 710, a transportation digital twin 720, an environment digital twin 730, a hospital digital twin 740, a maintenance digital twin 750, and an energy digital twin 760.

Information of interest of the parking lot digital twin 710 may include a vehicle location, a vehicle type, etc.

Information of interest of the transportation digital twin 720 may include a vehicle location and a vehicle speed.

The information of interest of the environment digital twin 730 may include a smoke exhaust rate of a vehicle and an exhaust gas grade.

Information of interest of the hospital digital twin 740 may include whether a patient can be transported and the number of available passengers in the vehicle.

Information of interest of the maintenance digital twin 750 may include a vehicle model and year, a maintenance schedule, and the like.

Information of interest of the energy digital twin 760 may include a vehicle energy source, battery capacity, and the like.

In the apparatus for configuring a digital twin of the digital twin system of each domain, a digital twin can be built for the purpose by using common technologies such as networks, big data, artificial intelligence, cloud computing, security, etc.

Figure 8:
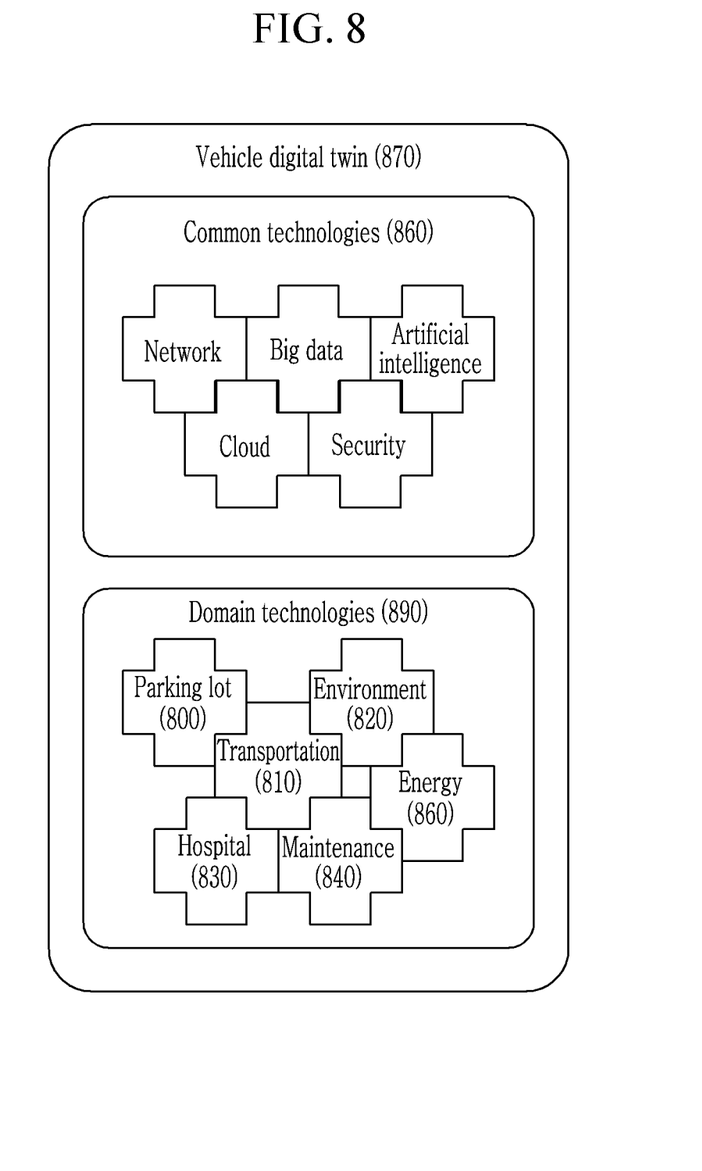
FIG. 8 is a diagram illustrating an example of a vehicle digital twin configuration according to an embodiment of the present invention.

FIG. 8 is a diagram illustrating an example of a vehicle digital twin configuration according to an embodiment of the present invention.

Referring to FIG. 8, domains to which the vehicle digital twin 800 is applied may include, for example, parking lots, transportation, environment, hospitals, maintenance, and energy, and the digital twin system of each domain may generate parking lot digital twin 810, a transportation digital twin 820, an environment digital twin 830, a hospital digital twin 840, a maintenance digital twin 850, and an energy digital twin 860, respectively, using common technologies, as shown in FIG. 7.

Figure 9:
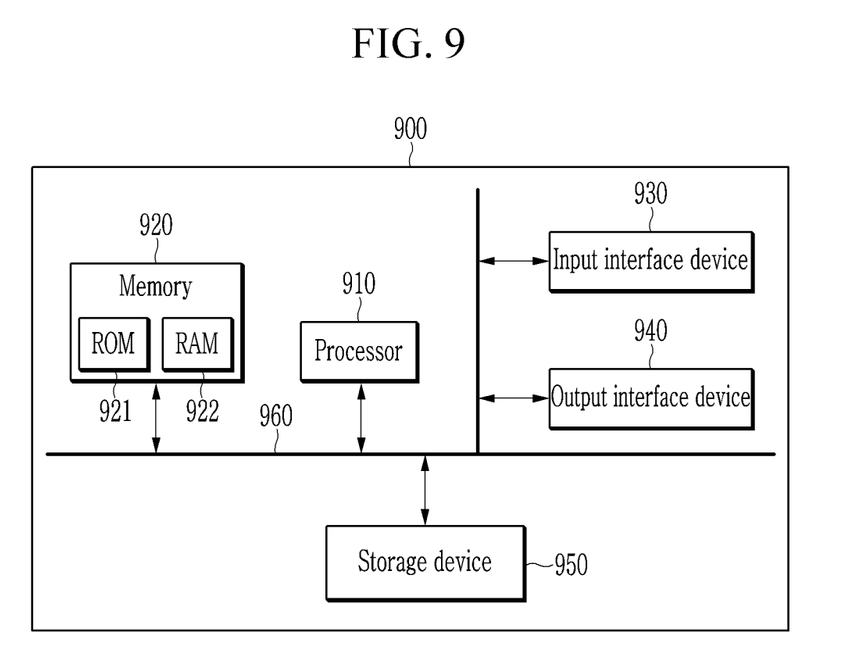
FIG. 9 is a diagram illustrating an apparatus for configuring a digital twin according to an embodiment of the present invention.

FIG. 9 is a diagram illustrating an apparatus for configuring a digital twin according to an embodiment of the present invention.

Referring to FIG. 9, the apparatus for configuring a digital twin 900 may represent a computing device in which the method for configuring a digital twin described above is implemented.

The apparatus for configuring a digital twin may include at least one of a processor 910, a memory 920, an input interface device 930, an output interface device 940, and a storage device 950. Each of the components may be connected by a bus 960 to communicate with each other. In addition, each of the components may be connected through an individual interface or an individual bus centered on the processor 910 instead of the common bus 960.

The processor 910 may be implemented as various types such as an application processor (AP), a central processing unit (CPU), a graphics processing unit (GPU), etc., and may be any semiconductor device that executes a command stored in the memory 920 or the storage device 950. The processor 910 may execute a program command stored in at least one of the memory 920 and the storage device 950. This processor 910 may be configured to embody the method for configuring a digital twin described based on FIGS. 1 to 8 above. For example, the processor 910 may load program commands for implementing at least some functions of the digital twin model author 222, the domain plug-in manager 224, the multi-role manager 226, and the data synchronizer 228 of the digital twin layer 220 described in FIG. 2 to the memory 920, and may control to perform the operation described with reference to FIGS. 1 to 8.

The memory 920 and the storage device 950 may include various types of volatile or nonvolatile storage media. For example, the memory 920 may include a read-only memory (ROM) 921 and a random access memory (RAM) 922. In an embodiment of the present invention, the memory 920 may be located inside or outside the processor 910, and the memory 920 may be connected to the processor 910 through various known means.

The input interface device 930 is configured to provide data to the processor 910.

The output interface device 940 is configured to output data from the processor 910.

In addition, at least some of the method for configuring a digital twin according to an embodiment of the present invention may be implemented as a program or software executed in a computing device, and the program or software may be stored in a computer-readable medium.

In addition, at least some of the method for configuring a digital twin according to an embodiment of the present invention may be implemented as hardware that can be electrically connected to a computing device.

According to an embodiment of the present invention, by sharing and managing information on digital twin objects distributed in multiple domains between digital twin systems, it is possible to more accurately check and respond more appropriately to problems that occur complexly across multiple domains. Furthermore, digital twin objects can perform multiple roles that allow digital twin objects to selectively perform roles that should be performed by domains in multiple domains. It is possible to create new services and businesses through interworking and multiple roles between these digital twin systems.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A method for configuring an observable object as a digital twin in a digital twin system of a domain, the method comprising:

defining a purpose for expressing the observable object as a digital twin in the domain;

organizing data based on roles of the observable object in the domain;

receiving information about a digital twin of the observable object that exists in other domains in which the observable object performs a different role;

configuring the observable object into the digital twin based on the data for the purpose;

interworking with a digital twin system of each of other domains in which the observable object performs a different role; and synchronizing the observable object and the digital twin; and maintaining the digital twin for observable object between the plurality of domains in the same state, wherein the configuring the observable object into the digital twin includes generating a digital twin having different characteristics from those of other domains to fit a purpose and roles specified in the domain for the observable object, wherein the role represents an execution function for a behavioral action to achieve the purpose.

2. The method of claim 1, wherein the organizing data includes configuring the data based on geometric three dimensions, time, and properties along with the role in the domain.

3. The method of claim 1, wherein the receiving includes receiving information about the digital twin of the observable object by interworking with a digital twin of another domain while digital twins of two domains are interworking.

4. The method of claim 1, wherein the synchronizing includes reflecting changes of the digital twin to the digital twin.

5. The method of claim 1, wherein the interworking includes:

receiving a request for information about the digital twin from the one of the other domains; and transmitting information about the digital twin to the one of the other domains.

6. An apparatus for configuring an observable object as a digital twin in a digital twin system of a domain, the apparatus comprising:

one or more computer-executable units being configured and executed by a processor using algorithms associated with at least one non-transitory storage device, the algorithms, when executed, causing the processor to execute the one or more computer-executable units, the one or more computer-executable units comprising:

a digital twin model author that defines a purpose for the observable object to perform a role in the domain, organizes data based on the role, and configures the observable object into a digital twin according to the purpose based on the data;

a domain plug-in manager that interworks the digital twin with a digital twin system in each of other domains;

a multi-role manager that manages properties according to roles performed by the observable object in a plurality of domains; and a data synchronizer that synchronizes between the observable object and the digital twin, wherein the digital twin model author configures the observable object as the digital twin by using the digital twin information about the observable object received from the other domain in which the observable object performs a different role, wherein the digital twin model author generates a digital twin having different characteristics from the those of other domain to fit a purpose and roles specified in the domain for the observable object, wherein the data synchronizer maintains the digital twin for the observable object between the plurality of domains in the same state, wherein the role represents an execution function for a behavioral action to achieve the purpose.

7. The apparatus of claim 6, wherein the domain plug-in manager searches a connectable digital twin system when the observable object moves to one of the other domains, and selects and connects a digital twin system that will perform the role of the observable object in the corresponding domain.

8. The apparatus of claim 6, wherein when the observable object moves to one of the other domains, the domain plug-in manager activates a digital twin registered in the corresponding domain.

9. The apparatus of claim 6, wherein the digital twin model author organizes the data based on the role, geometric three dimensions, time, and properties in the domain.

* * * * *